US010670742B2

United States Patent
Jackson et al.

(10) Patent No.: US 10,670,742 B2
(45) Date of Patent: *Jun. 2, 2020

(54) METHOD AND APPARATUS TO MINIMISE THE ONSET AND RECOVERY TIME OF A SILICON PHOTOMULTIPLIER

(71) Applicant: SensL Technologies Ltd., Cork (IE)

(72) Inventors: John Carlton Jackson, Cobh (IE); Peter Ward, Oundle (GB); Donal Cronin, Blackrock (IE); Mike Quinlan, Limerick (IE)

(73) Assignee: SENSL TECHNOLOGIES LTD., County Cork (IE)

( * ) Notice: Subject to any disclaimer, the term of this patent is extended or adjusted under 35 U.S.C. 154(b) by 299 days.

This patent is subject to a terminal disclaimer.

(21) Appl. No.: 15/726,140

(22) Filed: Oct. 5, 2017

(65) Prior Publication Data

US 2018/0106911 A1 Apr. 19, 2018

Related U.S. Application Data

(63) Continuation of application No. 12/672,850, filed as application No. PCT/GB2008/050681 on Aug. 8, 2008, now Pat. No. 9,810,795.

(30) Foreign Application Priority Data

Aug. 10, 2007 (GB) .................................. 0715561.7

(51) Int. Cl.
*G01T 1/24* (2006.01)
*H01L 27/144* (2006.01)
*H01L 31/02* (2006.01)

(52) U.S. Cl.
CPC .............. *G01T 1/243* (2013.01); *G01T 1/248* (2013.01); *H01L 27/1446* (2013.01); *H01L 31/02027* (2013.01)

(58) Field of Classification Search
CPC ......... G01T 1/243; G01T 1/248; G01T 1/208; G01T 1/24; H01L 27/1446;
(Continued)

(56) References Cited

U.S. PATENT DOCUMENTS 4,710,817 A * 12/1987 Ando ..................... H04N 5/357
348/241
6,340,818 B1 * 1/2002 Izumi ................ H01L 27/14609
250/208.1
(Continued)

FOREIGN PATENT DOCUMENTS

WO WO-2006090633 A1 * 8/2006 ........... H04N 5/3532

*Primary Examiner* — Que Tan Le
*Assistant Examiner* — Jennifer D Bennett
(74) *Attorney, Agent, or Firm* — Polansky & Associates, P.L.L.C.

(57) ABSTRACT

Silicon photomultiplier circuitry is provided that comprises at least one silicon photomultiplier pixel, each pixel comprising a plurality of silicon photomultiplier microcells. The silicon photomultiplier circuitry comprises control circuitry adapted to maintain a substantially constant voltage on a connection node between microcells of the pixel. The control circuitry is adapted to minimise the onset and recovery time of an output signal by maintaining a substantially constant voltage on the connection node.

26 Claims, 15 Drawing Sheets

(58) Field of Classification Search
CPC ..... H01L 27/14609; H01J 43/04; H01J 40/14;
H01J 43/246; G01J 1/44; H03F 3/08;
H03F 3/087
See application file for complete search history.

(56) References Cited

U.S. PATENT DOCUMENTS

| | | | | |
|---|---|---|---|---|
| 7,800,070 | B2* | 9/2010 | Weinberg | A61B 6/12 |
| | | | | 250/363.03 |
| 9,810,795 | B2* | 11/2017 | Jackson | H01L 27/1446 |
| 2001/0020863 | A1* | 9/2001 | Cova | G01J 1/44 |
| | | | | 327/514 |
| 2001/0052941 | A1* | 12/2001 | Matsunaga | H01L 27/14609 |
| | | | | 348/308 |
| 2002/0054389 | A1* | 5/2002 | Takada | H01L 27/14609 |
| | | | | 358/513 |
| 2004/0245592 | A1* | 12/2004 | Harmon | G01J 1/4228 |
| | | | | 257/438 |
| 2007/0024737 | A1* | 2/2007 | Nakamura | H04N 5/23293 |
| | | | | 348/335 |
| 2009/0009643 | A1* | 1/2009 | Muroshima | H04N 5/3532 |
| | | | | 348/308 |
| 2009/0315135 | A1* | 12/2009 | Finkelstein | H01L 31/107 |
| | | | | 257/438 |
| 2011/0079727 | A1* | 4/2011 | Prescher | G01T 1/248 |
| | | | | 250/370.1 |

* cited by examiner

METHOD AND APPARATUS TO MINIMISE THE ONSET AND RECOVERY TIME OF A SILICON PHOTOMULTIPLIER

CROSS-REFERENCE TO RELATED APPLICATIONS

This application is a continuation of copending U.S. patent application Ser. No. 12/672,850 which is the U.S. National Stage of International Patent Application Serial No. PCT/GB2008/050681, filed on Aug. 8, 2008, and claims priority to, and the benefit of, United Kingdom Patent Application No. 0715561.7, filed Aug. 10, 2007, the disclosures of which are hereby incorporated by reference in their entireties.

The present invention relates to a method and apparatus relating to silicon photomultipliers and silicon photomultiplier circuitry.

1. DEFINITIONS

The following are definitions of terminology used in the description that follows.

| Term | Definition |
| --- | --- |
| SPM | silicon photomultiplier |
| silicon photomultiplier | the silicon photomultiplier is a collection of microcells in a large array |
| microcell | a microcell is the smallest unit cell of a SPM. This includes a photodiode which can be operated in Geiger mode in series with a quenching element. |
| pixel | the SPM pixel is a collection of microcells connected in parallel |
| submodule | this is an array of pixels |
| module | this is a collection of SPM submodules made into a larger array. |
| onset time | time of the first output pulse of the SPM in response to a photon |
| recovery time | this is the time of the output response from the SPM as the device recovers and is after the onset time |
| PET | positron emission tomography |

2. BACKGROUND TO THE INVENTION

The silicon photomultiplier (SPM) is a semiconductor detector which operates in a manner which is similar to the optical and electrical operation of the vacuum tube based photomultiplier tube, or PMT or the microchannel plate, or MCP. The SPM is designed so that the detector converts incident photons into charge, multiplies that charge through an internal gain mechanism and outputs the resulting charge to the output of the SPM detector. In this way photons are converted into currents which can be easily measured using external circuitry.

Figure 1:
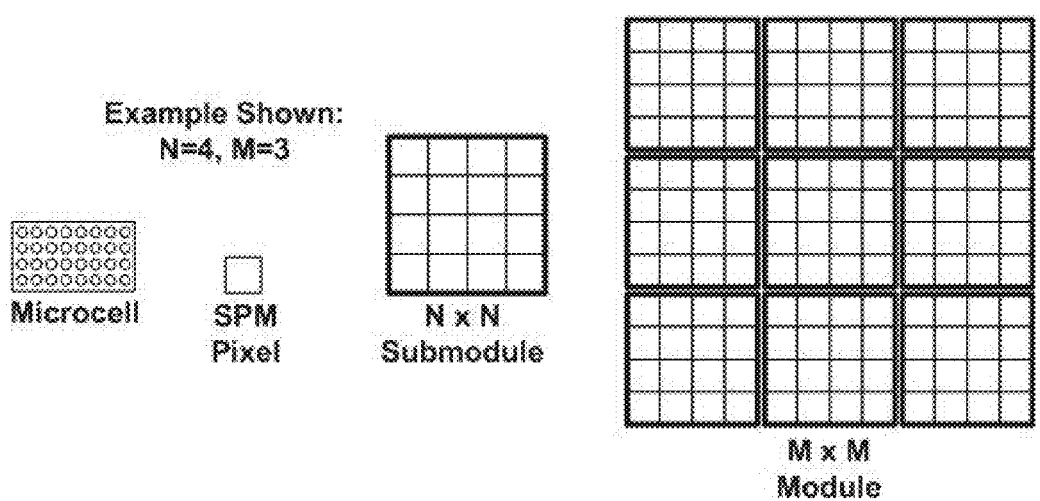
FIG. 1 is a description, not to scale, of the SPM detector which is used to describe how the detector size can increase from a collection of SPM microcells which are parallel connected to form a SPM pixel to a SPM submodule which is an array of SPM pixels to a SPM module, which is an array of SPM submodules. Drawing not to scale. For instance the microcell is much smaller than the SPM pixel and in fact a SPM pixel is typically made up of a large number of SPM microcells.

The basic SPM is a large array of microcells. This is known as a SPM pixel. An array of SPM pixels into a larger area SPM detector is known as a submodule. A larger array of submodules is known as a module. This is detailed in FIG. 1.

The basis for the SPM is the combination of a Geiger mode photodiode which is biased above the breakdown voltage of the diode and the quenching resistor which is used to quench the photodiode and allow the device to recover and allow detection of another photon. The operation of the SPM operation is described in a publication by Z. Y. Sadygov et al., "Avalanche Semiconductor Radiation Detectors", Trans. Nucl. Sci. Vol. 43, No. 3 (1996) pg. 1009-1013. This publication discusses the use of a photodiode which is biased above the breakdown voltage as described by Roland H. Haitz, Model for the electrical behavior of microplasma, Journal of applied physics, vol. 35, no. 5, May 1964, pg.

1370-1376. The use of a resistance to form the passive quenching element required to quench an avalanche breakdown event is discussed in detail in Sadygov. For details of the passive quenching operation, the references by Roland H. Haitz, Studies on Optical Coupling Between Silicon p-n Junctions, Solid-State Electronics, vol. 8, pg. 417-425, 1965 and Robert G. W. Brown and Kevin D. Ridley and John G. Rarity, Characterization of Silicon Avalanche Photodiodes for Photon Correlation Measurements. 1: Passive Quenching, Applied Optics, vol. 25, no. 22, pg. 4122-4126, November, 1986 are recommended. They show the passive quenching of the photodiode which is operated above the breakdown voltage result in a pulse of current flowing through the photodiode during a breakdown event. The full operation of the SPM is detailed in several prior art inventions by the current inventors. These prior art inventions are discussed below.

In our co-pending PCT/GB2006/050123, Light Sensor Module, this patent describes a light sensor module consisting of a number of light sensing elements arranged on a substrate. The module can be operated in a way that produces a combined output signal indicative of an overall level of light falling on the elements. Adjacent light sensing elements sit closely together to form a close-tiled arrangement of the elements covering a large area. This allows a larger area detector to be formed through the use of many smaller detectors combined together.

In our co-pending GB 0621495.1, Method of Assembling a Light Element Module and Light Element Module Assembly, we describe a method of assembling a light sensor module with a light sensing element optically coupled to another optical element, where an intermediate layer is adapted to provide a predetermined level of optical coupling between the optical element and the light sensing element. This allows the formation of a large area arrays of SPM detectors which use an optical layer to provide both electrical connections and the optical coupling to the optical element being viewed or imaged.

In our co-pending GB 0704206.2, Optical Position Sensitive Detector, we describe an optical position sensitive detector which has multiple photosensitive areas, each photosensitive area is capable of producing a signal in response to a photon incident thereon in Geiger mode. Each photosensitive area can provide a signal or signals which may be used to indicate the position of an optical beam incident on the detector surface. This uses a pixellated SPM output which allows for a position sensitive detector to be formed with a high internal gain.

In our co-pending GB 0714770.5, Light Sensor, we describe a method of producing a light sensing arrangement for use in a light sensor. The patent describes how a multiple of individual light sensing elements on a carrier each have a notch formed in them. The purpose of the notch is to allow for electrical connection between the carrier and a surface of the element when the elements are tiled together to form a customisable large detection area.

These allow for the formation of a large area SPM array which is then used to image or to detect light incident onto the array. An issue with the formation of large area detectors however, is the preservation of the timing response of the detectors when they are placed into a large area array. This is particularly important for areas such as high time resolution positron emission tomography, or PET. See reference, Prospects for Time-of-Flight PET using LSO Scintillator, W. W. Moses, and S. E. Derenzo, IEEE Transactions on Nuclear Science NS-46, pp. 474-478 (1999). This system describes a PET system in which the timing properties of lutetium orthosilicate LSO crystals are excited with a 511 keV photon. In a PET system, two 511 keV photons are emitted from the body which are approximately 180 degrees out of phase with one another. The single high energy photon is converted to a number of lower energy photons in the visible spectrum which are detected using a standard PMT in the current state of the art. For LSO approximately 20,000 to 30,000 lower energy visible wavelength photons are emitted for each of the 511 keV photons incident on the crystal. The decay time of the LSO output is approximately 40 ns (See Moses). The challenge for the detection system in a PET system is two fold: First the detectors must be of sufficient high detection efficiency to be able to convert the photons into a measurable response and the detection area is large enough to allow sufficient photons to be obtained. Second the detector must be sufficiently fast to allow the detection of the incident optical pulse with sufficient accuracy to allow the pulse to be measured and analysed. This results in two specifications for PET that must be meet with a detector. These are that the detector must be large area and also fast. As described in Moses, the coincidence resolving time is the time resolution that is obtained from detecting the coincidence between the two photons emitted during a positron annihilation in PET. Because of the speed of light which is a constant given by $c=3\times10^8$ m/s the detector, including both the scintallator crystal and the optical detector must be suitably fast to allow detection of the pulses under with a resolution under 500 ps. This fast resolution is required to allow position of the photon emission to be resolved to a 7.5 cm resolution(see Moses). To increase the resolution, faster detectors are required. It is possible to increase the resolution through repetitive measurements and signal processing, but this slows the data acquisition process and decreases overall system performance. High timing resolution detectors are therefore a requirement for PET. To perform this coincidence timing requires both a fast scintillator crystal, for high energy to lower energy conversion, and a subsequently fast and accurate optical detector with the ability to reconstruct the output pulse from the crystal.

Figure 2:
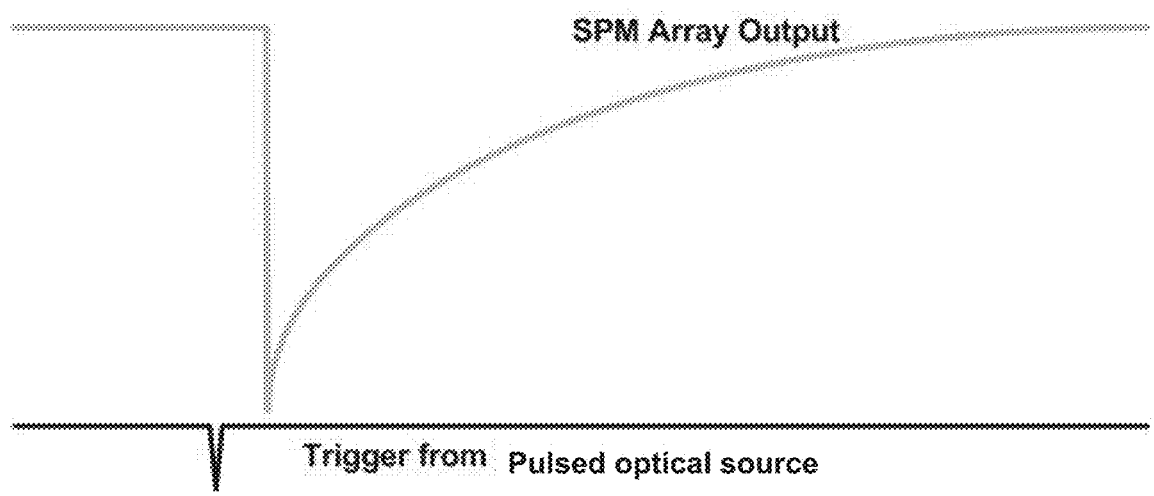
FIG. 2 is a graph showing the timing response of the summed output of quantity 8 of 3 mm×3 mm SPM pixels flip chipped onto a flexible substrate in accordance with GB 0621495.1, Method of Assembling a Light Element Module and Light Element Module Assembly. The recovery timing resolution for the large array is on the order of 400 ns. This is approximately 8 times larger than the subsequent recovery time for a single 3 mm×3 mm SPM pixel. This is an implementation of GB 0621495.1, Method of Assembling a Light Element Module and Light Element Module Assembly.

To describe a problem with the current state of the art as appreciated by the present applicant, it is best to review several publications of the inventors and of other state of the art material in the literature. SPM detectors have been shown to have a fast rise time. See the publication by the inventors, Study of the Properties of New SPM Detectors, A G Stewart, E Greene-O'Sullivan, D J Herbert, V Saveliev, F Quinlan, L Wall, P J Hughes, A Mathewson and J C Jackson, SPIE: Semiconductor Photodetectors III, Vol. 6119, 2006. This describes a SPM detector with a 1 mm×1 mm active area with onset times of 1.4 ns and recovery times of 8.7 ns. This active area is too small for many applications requiring large area detection. The inventions of the authors, described in relation to the above-mentioned co-pending applications, were used to overcome the limitations of the smaller area and the subsequent publication, Tiled Silicon Photomultipliers for large area, low light sensing applications, P J Hughes, D Herbert, A Stewart, J C Jackson, Proc. of SPIE: Semiconductor Photodetectors IV, Vol. 6471, 2007 demonstrates the formation of a large area detector with area of 1.2 cm×1.2 cm. This represents a device structure which is 144 times larger than the previous generation of 1 mm×1 mm active area detector. However, as reported in the publication from 2007, the onset response times were on the order of 10 s of nanoseconds. Further analysis and work on this array structure show that the recovery times of the array were degraded significantly over the recovery time of a single SPM pixel. The recovery timing for the array appeared to increase with increasing number of active elements in the array. This results from reducing this to practice show that the output response times are too slow for the recovery of the fast response times that occur in a fast crystal such as LSO, as an example. This is shown graphically in FIG. 2 in which a fast optical source such as a light emitting diode is pulsed via an electrical stimulus. The electrical stimulus is shown in the Figure. This electrical stimulus causes the light source to emit a brief optical pulse which is detected by the SPM submodule. In this Figure we show the response times measured for the SPM submodule of quantity 8 of 3 mm×3 mm SPM pixels. The recovery time for a single SPM 3 mm×3 mm detector was on the order of 50 ns. When the SPM was placed into an array with 8 active elements, the recovery timing degraded to 400 ns which is a factor of 8 times degradation in the output response.

This is unsuitable for high time resolution and fast detection applications such as PET. In patent application WO06111883 A2: DIGITAL SILICON PHOTOMULTIPLIER FOR TOF-PET and WO06111869 A2: PET/MR SCANNER WITH TIME-OF-FLIGHT CAPABILITY the need for high time resolution detection is discussed. In these patent applications the need for high resolution detectors in a PET or PET/MRI system are described. These applications make use of PCT/GB2006/050123, PCT/GB2006/050122 Digital Avalanche Photodiode, WO04102680A1 A Photodiode, and other patents referenced in this invention claim.

An understanding of the problem was obtained by the present applicant after rigorous analysis of the SPM internal operation and the circuitry which is used to drive and measure the current through the SPM during operation of the array.

3. OPERATION OF THE SPM ARRAY

Figure 3:
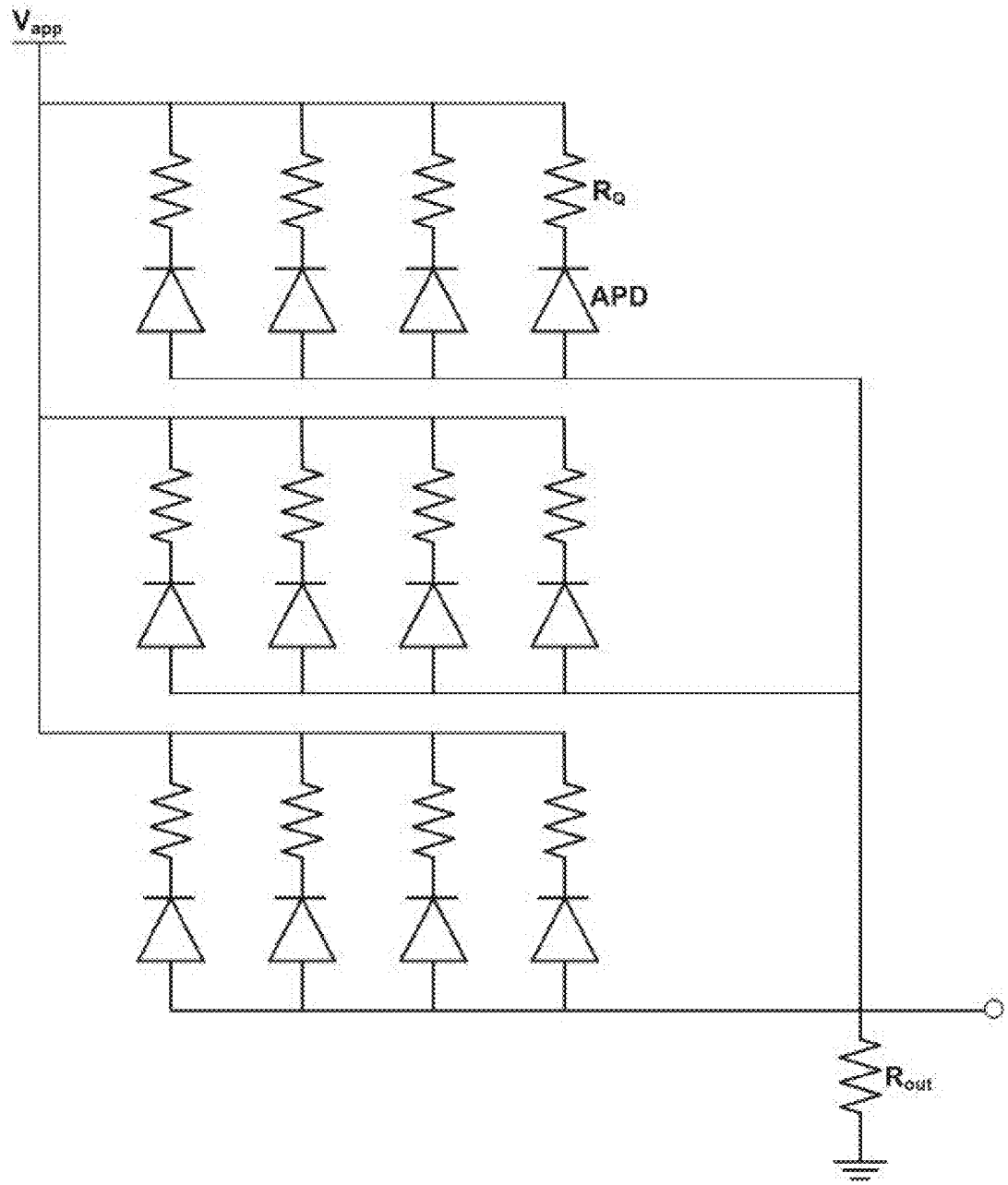
FIG. 3 is a schematic showing the SPM with the current state of the art output resistor on the output of the SPM array.

The SPM array can be understood in operation by looking at the equivalent circuit model by which the device is operated and the output from the SPM is readout. Each microcell in the SPM consists of a photodiode and a quenching element which in this case is a suitably sized quenching resistor to allow the photodiode to be quenched when it breaks down during a Geiger mode event. This quenching element can be any element such as a transistor or current controlled source. A resistor is the simplest form of the quenching element and is used throughout this invention for illustration purposes. This is shown in FIG. 3 for the SPM. The SPM consists of a large array of microcells which are connected in parallel to form the SPM pixel. In FIG. 3, the array of Rq, quench resistor, and APD, Geiger mode photodiode, are internal to the SPM. In FIG. 3, the output resistor, Rout is external to the SPM. During a breakdown event the microcell undergoes an avalanche breakdown. A good review of the avalanche initiation process and avalanche breakdown is given in a publication by Robert J. McIntyre, On the Avalanche Initiation Probability of Avalanche Diodes Above the Breakdown Voltage, IEEE Transactions on Electron Devices, vol. 20, no. 7, pg. 637-641, July, 1973. A simulation of this process has been performed in J. C. Jackson, A. P. Morrison, B. Lane, Vasileios Sinnis and A. Mathewson, Simulation of Dark Count in Geiger Mode Avalanche Photodiodes, Simulation of Semiconductor Processes and Devices 2001. SISPAD, Athens, Greece, September, 2001. These show that impact ionisation in the photodiode depletion region lead to a breakdown of the photodiode and large current flow during a photon or thermally generated charge event. As shown the output circuit for reading out the SPM is simply a resistor, shown as Rout, which is connected to the output node of the SPM array. This output node can be on either side of the SPM microcell. The inclusion of the output resistor at the output node allows the SPM pixel current to be converted to a voltage for measurement on an oscilloscope or other voltage measurement devices. This is the typical way in which SPM performance is measured and described. Several references in the literature describe how this type of circuit operation would work.

B. Dolgoshein, Silicon photomultipliers in particle physics: possibilities and limitations, Innovative detectors for supercolliders, Copyright World Scientific Publishing Co. Pte. Ltd., doi:10.1142/9789812702951_0029 shows a common output configuration which shows a 50 ohm resistor in series with the SPM array. This arrangement then monitors the voltage on the oscilloscope showing the onset and recovery time of the SPM pixel. This is shown to be a fast response on the order of nanoseconds onset and recovery.

A. N. Otte, B. Dolgoshein, H. G. Moser, R. Mirzoyan, and M. Teshima, Status of silicon photomultiplier developments as optical sensors for MAGIC/EUSO-like detectors, $29^{th}$ International Cosmic Ray Conference, Pune, pg. 101-106, 2005. Otte demonstrates in his paper a method of reading out a large array of SPM detectors. In this configuration, Otte uses a biasing resistor to bias the SPM pixel, he then drives the signal from the SPM pixel through a voltage pre amplifier before performing a summing operation with a transimpedance amplifier.

Limited Geiger-mode microcell silicon photodiode: new results, G. Bondarenko, P. Buzhan, B. Dolgoshein, V. Golovin, E. Guschin, A. Ilyin, V. Kaplin, A. Karakash, R. Klanner, V. Pokachalov, E. Popova, K. Smirnov, Nuclear Instruments and Methods in Physics Research A 442, pg. 187-192, 2000. In this publication a circuit is detailed which uses a voltage output on the SPM to allow for readout and viewing of the output from the SPM output response. An input filter is shown in the figure and the output is across a resistance.

Each of these circuit configurations demonstrate known methods of reading out the SPM detector. The standard manner for reading out a SPM detector is to drop the voltage of the output across a resistor and then amplify that voltage level with external amplifiers to provide a valid output signal. The limitation with this circuit arrangement is not apparent until large numbers of SPM pixels are tiled together to form a large submodule array. In the previous inventions as set out in the above-mentioned co-pending applications, large arrays of SPM pixels can be formed together to provide a large active area. However, as shown above there is an issue in SPM performance when large arrays of SPM detectors are tiled together. This issue with performance is that the onset and recovery times of the SPM detector are considerably longer than those measured on single SPM pixels. There is also another problem in that because a voltage must develop across the output resistor, Rout, there is feedback from the voltage on Rout which will lower the voltage on the remaining non-firing microcells in the SPM pixel. This lowers the photodiode's ability to detect a photon. It has been shown that the recovery time of the SPM array is proportional to the number of SPM pixels that are in the SPM submodule. It is required to perform a detailed analysis of the intrinsic parasitic resistances and capacitances in the SPM pixel and the manner in which the SPM is combined with electronics circuitry to understand the issues surrounding this phenomenon.

Figure 4:
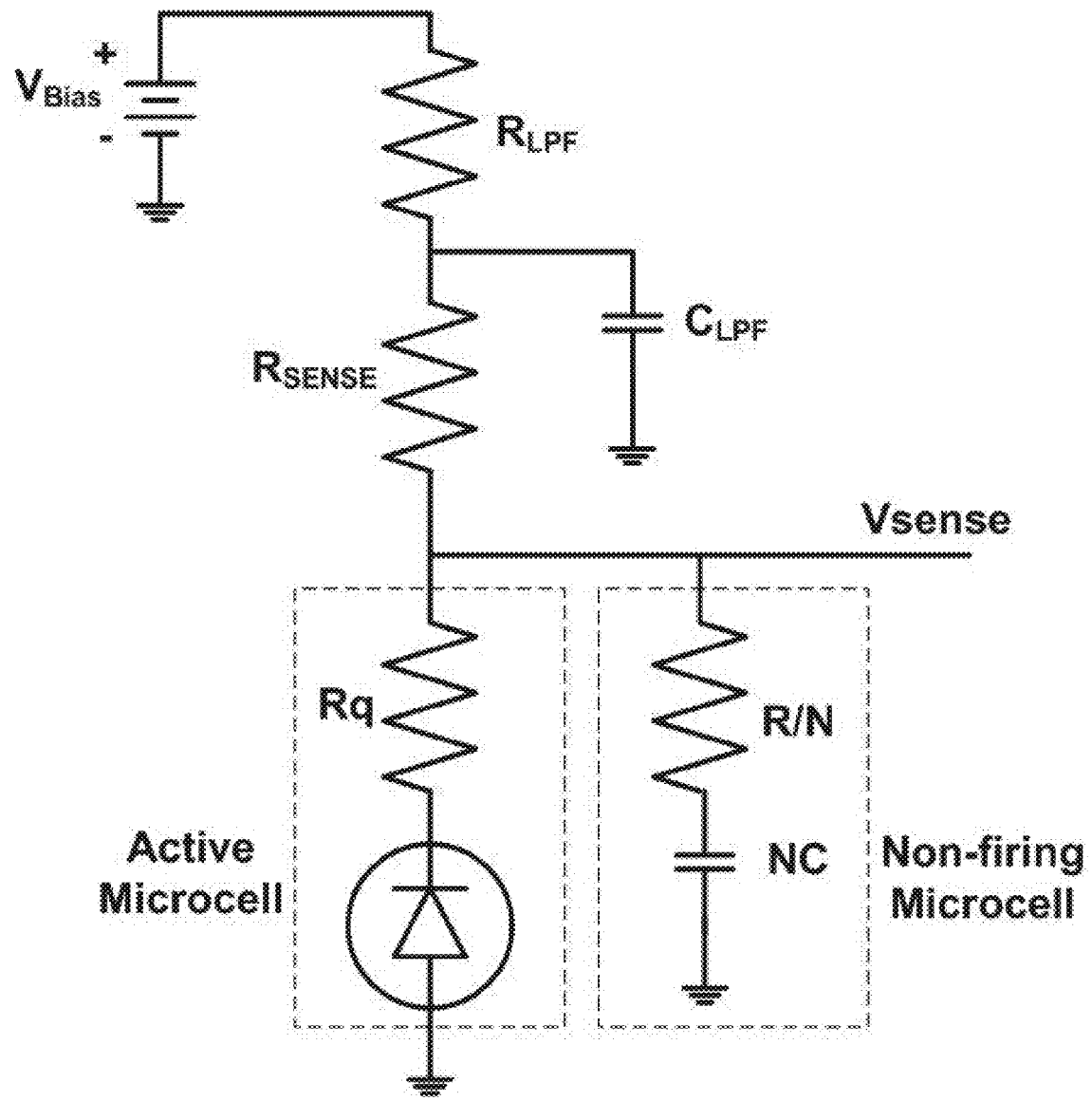
FIG. 4 is a more detailed schematic showing the capacitances which exist in the SPM between the firing active microcells and the non-firing microcells.
Figure 5:
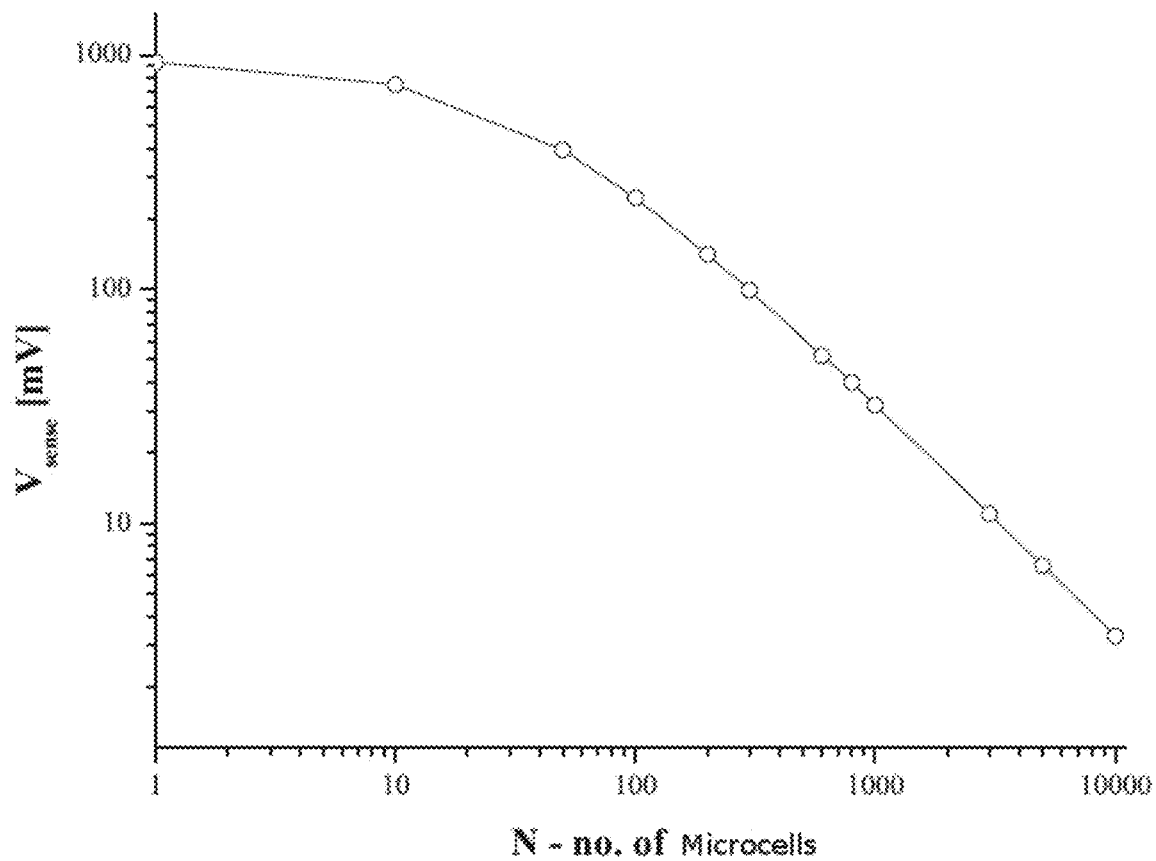
FIG. 5 shows that using a state of the art output circuitry for biasing and reading out a SPM, as the number of pixels in the SPM and therefore in the non-firing microcells increases, the voltage available on the output of the SPM decreases.

The following discusses a practical circuit implementation used to readout SPM pulses. The readout circuit shown in FIG. 3 is not in practice used as noise will develop across the output resistor which will impair the performance of the SPM. An alternative bias and readout scheme is shown in FIG. 4. This bias and readout scheme uses a low pass filter on the input bias voltage to remove some of the high frequency noise which is present on the circuit arrangement in FIG. 3. When the SPM pixel is biased according to standard state of the art circuitry as shown in FIG. 4, when a photon event occurs, current will pass through the microcell. This gain is approximately 1 million electrons. The current flowing through the microcell must follow the standard Kirchhoff's current law and current must flow from another location in the circuit so that conservation of charge in the microcell node is preserved. From the diagram in FIG. 4, the current into the microcell comes from both the bias current which is connected to Vbias and also from current in the neighboring non-firing microcells. This can be understood by explaining the method by which the large array of SPM microcells can be simplified to understand the device operation. The parallel array of microcells can be simplified by taking the resistance of the microcell resistor and dividing this by the total number of non-firing cells, or N in this case. The equivalent capacitance can be determined by the total number of non-firing cells, or N, multiplied by capacitance of the photodiode, or C in this case. This can be done because when the non-firing cells have not fired, the voltage is the same at the node between the microcell resistance and photodiode for all microcells. This means that by circuit analysis you can approximate the total resistance of the array by treating the microcells to be in parallel. Therefore the Resistances are lowered by a factor of N and the capacitances in parallel are increased by a factor of N according to standard circuit theory. So far in this model of the circuit the parasitic capacitances of the tracks and bond pads have been negated. They will be brought into this analysis at a later stage. For the readout of the common SPM circuit, the voltage, in this case Vbias is applied typically through a filtering circuit to stabilise the voltage supplied on to the SPM array. This is a known technique common in biasing photodiodes. This consists in FIG. 4 of a Rlpf which is a low pass filter resistance or typical value 10 k ohm, and Clpf which is the low pass capacitance of typical value of 10 nF. The voltage is then applied to the SPM through the Rsense resistor which is typically 10 k ohms in value. This filter network provides voltage to the SPM array. Assuming that there are no events caused by photons entering into the photodiode or thermally generated carriers, then the voltage between Rsense and the microcells node which is represented by Vsense remains a constant value. This value is the applied bias voltage Vbias. When a breakdown event occurs in the active microcell, then current flows through the microcell in which the breakdown event has occurred. In this common mode of biasing the SPM pixel, the voltage on the output node Vsense only changes when current flows through the Rsense resistor. When there are a relatively small number of microcells in the SPM pixel, the non-firing microcell resistance and capacitance is small. R/N is still a large number and N*C is still a relatively small number. During a breakdown event in the active microcell, most of the current required to satisfy Kirchoff's current law comes through the Rsense resistor and there is a large voltage swing on the Vsense node. For the case of a large number of microcells in a SPM pixel this is not the case. As the number of microcells in the SPM pixel increases, the equivalent resistance decreases and the capacitance increases. Therefore some of the current that can be supplied during the active microcell firing will come from the non-firing microcells and not through the Rsense node. This will result in a lower voltage swing on the output of the SPM. In a large SPM, when the active microcell undergoes a breakdown event, then the current flowing from the non-firing microcells can become significant. This is highlighted by looking at the equivalent resistance and capacitance of the non-firing microcells in the equivalent circuit. If we assume that the C of the photodiode is a typical value of 35 fF and the Rq quench resistor is a typical value of 300 k Ohm, then for varying non-firing microcell numbers we have the following values of equivalent R and C:

10 non-firing microcells: $R/N=300,000/10=30,000$ ohm $C*N=35$ fF*10=350 fF 100 non-firing microcells: $R/N=300,000/100=3,000$ ohm $C*N=35$ fF*100=3.5 pF 1,000 non-firing microcells: $R/N=300,000/1,000=300$ ohm $C*N=35$ fF*1,000=35 pF 10,000 non-firing microcells: $R/N=300,000/10,000=30$ ohm $C*N=35$ fF*10,000=350 pF As the number of non-firing microcells is increased and the resistance of the equivalent resistance decreases and the capacitance increases, the amount of charge that flows from the bias circuit and Rsense during a breakdown event is decreased. More and more current flows from the non-firing microcells during a breakdown event. The output voltage that is measured on the Vsense node in FIG. 4 decreases with the increasing number of microcells in the SPM pixel. This is shown in FIG. 5. In FIG. 5 the Vsense voltage of FIG. 4 is simulated with a varying number of microcells. As can be seen the increasing number of microcells leads to a decrease in the output voltage. Additionally this analysis also shows that once the current has been depleted from any capacitances on the Vsense node, it must be replenished and this replenishment will be at the RC time constant of the SPM pixel. However, the simple model of FIG. 4 does not explain why the timing of a SPM pixel is degraded when it is put into a large array. FIG. 4 the capacitances from bondpads and metal connection tracks has been removed for simplified analysis. In the simple model of FIG. 4 as the number of SPM microcells is increased, as SPM size increases, the RC time constant of the microcell equivalent circuit remains constant. This is shown below for varying microcell count.

10 non-firing microcells: $R/N=300,000/10=30,000$ ohm $C*N=35$ fF*10=350 fF $RC=(300,000/(10))*((10)*35E-15)=10.5$ ns 100 non-firing microcells: $R/N=300,000/100=3,000$ ohm $C*N=35$ fF*100=3.5 pF $RC=(300,000/(100))*((100)*35E-15)=10.5$ ns 1,000 non-firing microcells: $R/N=300,000/1,000=300$ ohm $C*N=35$ fF*1,000=35 pF $$RC = (300{,}000/(1{,}000))*((1{,}000)*35E\text{-}15) = 10.5 \text{ ns}$$

10,000 non-firing microcells: $R/N = 300{,}000/10{,}000 = 30$ ohm $$C*N = 35 \text{ fF} * 10{,}000 = 350 \text{ pF}$$

$$RC = (300{,}000/(10{,}000))*((10{,}000)*35E\text{-}15) = 10.5 \text{ ns}$$

Figure 6:
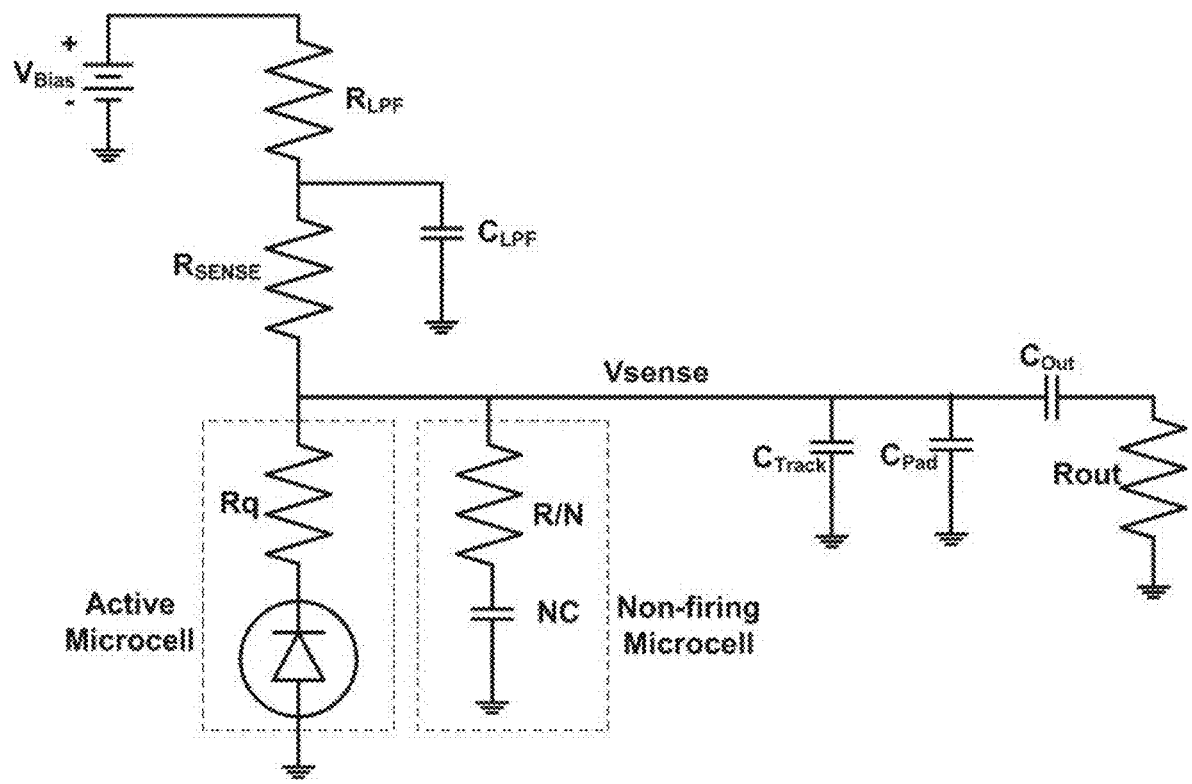
FIG. 6 is a schematic of the full SPM pixel with state of the art biasing and output circuitry showing the parasitic capacitances that will reduce the timing of the SPM pixel and SPM submodule and SPM module.

This does not fully explain the degradation in timing for large area SPM pixels, submodules and modules. To understand why the timing is reduced it is important to look at a more complicated model which takes into account the additional capacitances that are present in a SPM pixel. In FIG. 6 a fuller model is presented to look into the timing response of the SPM pixel and submodule. In the schematic in FIG. 6 we have added the additional capacitance that would be present from the metal tracking capacitance. This is still a simplified model and for simplicity the inductance of tracking lines and resistances have been left out. For a first order approximation to investigate the timing differences this is sufficient. The capacitance of the metal track is given as Ctrack in FIG. 6. This capacitance is related to the capacitance of the metal connecting the microcells in the SPM pixel to the output node presents to the SPM pixel. This capacitance is on the order of pico Farads to micro Farads. On the output node there is another significant capacitance and this is the capacitance of the bondpad contact point. This is shown as Cpad in FIG. 6. This capacitance can be on the order of 100 s of femto Farads to pico Farads. Once this parasitic capacitance is added to the model, it is possible to see that there is a no resistance between the capacitance of Ctrack and Cpad and the Vsense node. In practice there will always be some resistance between this node due to the resistance of the metal, however, this resistance is always smaller than the R/N resistance of the microcells and the Rsense in the current bias scheme. Therefore it is neglected in this simple model. When an active microcell fires, the current that will flow through the active microcell will now be supplied from the Ctrack and Cpad capacitances. Less current will flow through Rsense because there is no resistance between Ctrack and Cpad to the Vsense node. This has been established with the model of FIG. 4. Once the voltage on the Vsense node has changed and the current reduced in any capacitances on Vsense, it is required to recharge this capacitance. This recharge occurs through the Rsense resistance and therefore the RC time constant of this recharge process is set by the RC time constant of the bias circuit and the equivalent capacitance on Vsense. This is because the current flowing in the firing microcell is being supplied by the parasitic and neighbouring capacitances and not from the bias circuitry alone. This leads to a situation where the onset and recovery time of the SPM increases with increasing capacitance. Larger SPM pixels, submodules and modules will have a reduced timing response according to the current state of the art manner in which they are scaled to large area size.

Additional Problems with Readout Through the dc Blocking Output Capacitor

The onset and recovery time constant of the SPM pixels has been shown to increase with the number of microcells in the SPM array. This is not shown to be due to the simple increase in the number of microcells, but as the total increase in the capacitance which is parasitic in a SPM array. This effect is seen in a single SPM pixel using current state of the art readout circuitry as the number of microcells in the SPM increases, then the recovery time of the SPM output pulse decreases. The current state of the art readout circuitry also has another problem in that it is possible to build up a dc offset on the Vsense node of the SPM which is not properly conveyed to the output. A common configuration for the output of a SPM is to use a dc blocking capacitor on the output of the SPM array at the Vsense node. This is shown in FIG. 6. In FIG. 6 the output of the SPM array at Vsense is shown to decouple through the output capacitance. A typical value for this is from 100 pF to 1 nF. This is a common technique to decouple the dc signal of the circuit and only output the ac signal. The current which flows through the dc blocking output capacitor is therefore equal to $I = Cour*/dt(Vsense-Vout)$. Vout is the voltage that is on the output node across Rout. It is possible with this circuitry with a high number of microcells firing that a dc bias can be present on the Vsense node which is not conveyed to the output node. This can present a problem in analysing the onset and recovery time of the SPM array and requires any analysis or comparison of timing response measured on varying SPM detectors to include a understanding of the output circuitry used in the measurement. The additional capacitance of the output node capacitor also requires recharging during recovery and will slow the recovery time of the SPM Vsense node.

Discussion on the Optimal Onset and Recovery Times

If the output circuitry and SPM pixel is designed according to the invention then the output recovery time of the SPM should be only related to the onset and recovery of the SPM pixel which is firing. It should not be dependent on the presence of additional pixels or other parasitic capacitances which increase the overall capacitance of the SPM. If the voltage on the output node Vsense can be kept to a constant value then no current will flow from the non-firing microcells. This will result in the rise time of the current pulse through the active microcell only limited by the rise time of the avalanche current in the microcell photodiode, which is known to be on the order of picoseconds, and the resistance of Rq, the quench resistor in series with the capacitance of the photodiode. The avalanching current through the photodiode will act to bring the node connection between the photodiode and the quenching resistor to a value close to ground potential. Therefore the full voltage from the Vsense node is available to flow across through the microcell. If we take a typical value of 30 Volts Vbias on the circuit, and 300 k ohms for the Rq value, then the current that is available to flow during a breakdown event is on the order of Vsense/Rq. Assuming that no, or a low, current is flowing in the SPM prior to breakdown Vsense and Vbias will be equal. There will be roughly $30/300{,}000 = 100$ LA to flow at breakdown. A SPM microcell is known to produce on order of 1,000,000 electrons in response to a single breakdown event. These 1,000,000 electrons give rise to a charge of 0.16 pC since $1{,}000{,}000*q$ where q is the electronic charge and is 1.6E-19C. Since 100 uA are available to flow through the microcell, the time of the breakdown pulse should be on the order of 1.6 ns. This is calculated by dividing the total charge by the amount of current available to flow in the microcell. This is given by the equation charge/current = 0.16 pC/100 uA = 1.6 ns. Once breakdown has occurred the field in the photodiode will diminish to the point that the breakdown field of the diode is reached. In most cases the breakdown voltage of a SPM microcell is 25-30 Volts. If we assume in this case that the microcell breakdown voltage is 25 Volts, then we know that there is only 5 volts with which to recharge the capacitance of the microcell photodiode. This is given by $(Vbias-Vphotodiode)/Rq = (30-25)/300{,}000 = \tilde{}17$ uA. Since we must recharge the 0.16 pC which have been transferred during the breakdown event, it is required to have a recharge time of 0.16 pC/17 uA=9.4 ns or 10 ns for discussion purposes. Therefore the onset and recovery time of the SPM microcell should be very fast and limited by internal resistances and capacitances and not external parasitics and output circuitry. In an ideal SPM pixel we should be able to see onset times of the SPM on the order of 1.6 ns and recovery times on the order of 10 ns for a microcell with the configurations described above. Since we are stating that the onset and recovery times of the SPM microcell and therefore the SPM pixel are on the order of 1.6 ns to 10 ns it is useful to calculate what the response times will be for various configurations of photodiode capacitance and quenching resistance. The onset, tonset, and recovery, trecovery, time constants are calculated below for various values of Rq.

$C$=35 fF, Rq=300,000, tonset=1.6 ns, trecovery=9.4 ns $C$=35 fF, Rq=200,000, tonset=1.1 ns, trecovery=6.4 ns $C$=35 fF, Rq=100,000, tonset=0.5 ns, trecovery=3.2 ns There exists an optimum value of C and Rq, combined with the capacitance external to the microcell, which will allow for the optimum response time of the SPM pixel to be achieved for any given application. Additionally, to increase the onset time of the signal, a capacitor can be added across Rq which will increase the onset time of the SPM. The values of C were not changed in this example as the capacitance of the photodiode gives rise to the charge that flows during a breakdown event. Lowering the capacitance will lower the amount of charge that is available to flow during a breakdown event. It is set by the breakdown voltage of the diode and the size of the photodiode in the microcell. An optimum value can be achieved which provides sufficient gain and suitable number of microcells in a given area for the application. If required to decrease the afterpulsing of the SPM microcell, then the resistances and capacitances can be accordingly adjusted. Increasing the hold off time of the photodiode after a Geiger breakdown event is a known technique to reduce afterpulsing.

This concept is discussed in more detail below along with implementations of circuitry that are suitable for reading out a SPM pixel and submodule.

Figure 7:
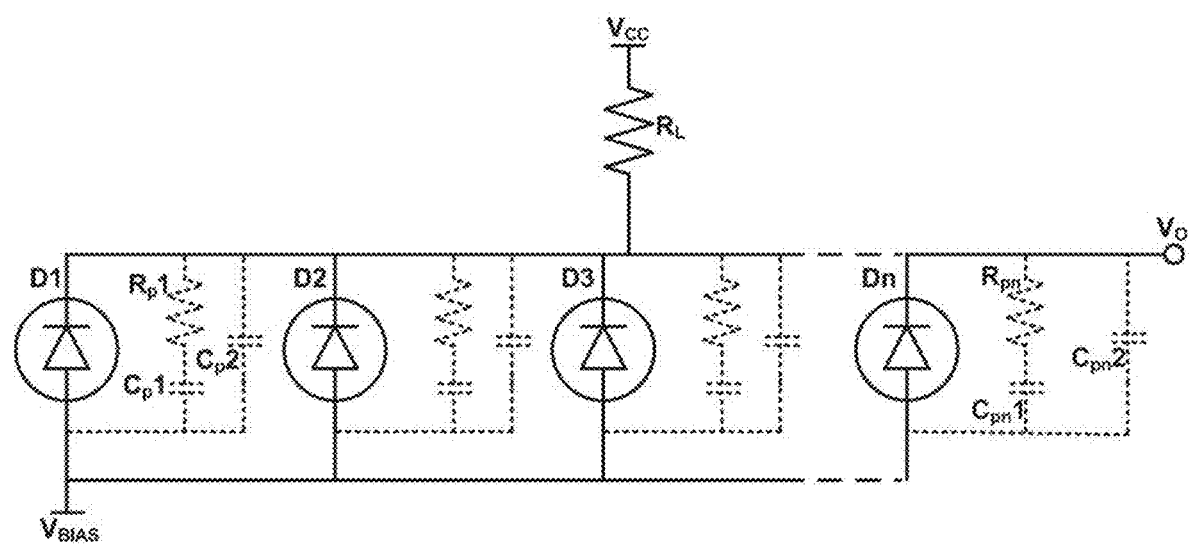
FIG. 7 illustrates a simple resistive pickup.

FIG. 7 below shows a simple means to pick up the current pulse signal from a photodiode array. Vcc is set to the onset of breakdown and each photodiode will momentarily switch (avalanche) when light falls upon it. This results in an increased current flow for the duration of the avalanche which, in turn, results in a voltage drop across RL. In this way Vo represents the total switching activity of the diode array.

Unfortunately, parasitic capacitance has a significant effect on this circuit. When a diode switches it has to discharge not only its own parasitic capacitance Cp1 and Cp1 but also that of its inactive neighbours and metal track and contact pad capacitances. This degrades onset and recovery time of the SPM. The recovery time constant is the product of RL and the paralleled total of the parasitic capacitance.

A way around this is to minimise the effect of the capacitors by maintaining a constant voltage across the diodes In this situation very little current will flow into or out of the capacitors. (I=Cdv/dt, etc.).

Figure 8:
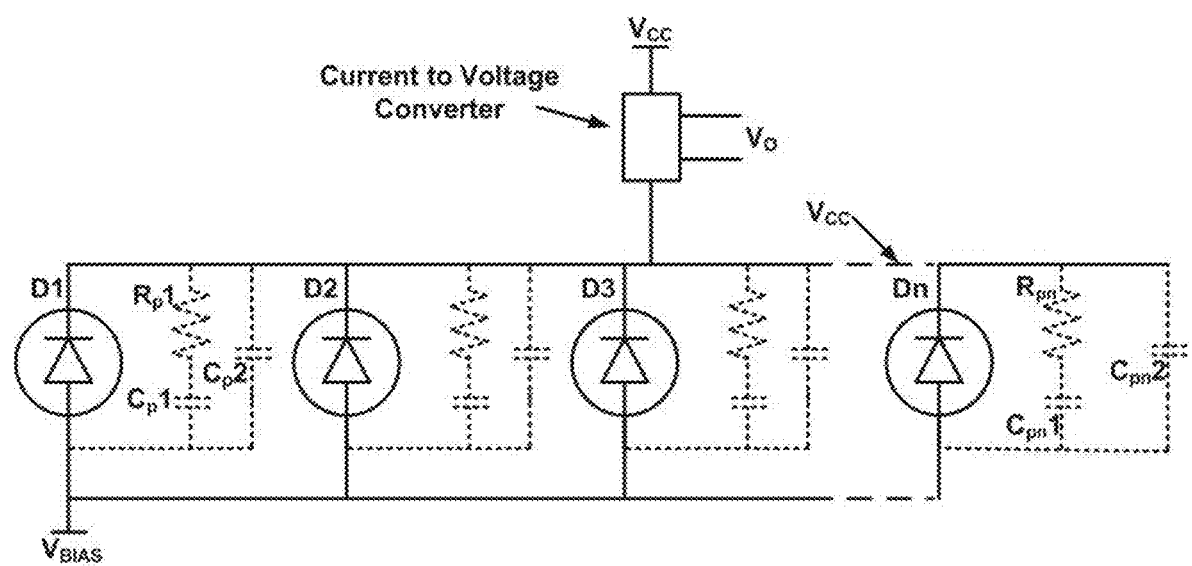
FIG. 8 illustrates signal current measurement.

This principle is shown in FIG. 8. The bias voltage across all diodes in the array is now constant. When a diode switches its charge demand is immediately met by the power supply without any need for the charge on the capacitors to change. The output signal is derived from a measurement of the change in current.

With this approach the onset and recovery times will not be significantly affected by the parasitic capacitance. The circuitry can be applied to either side of the SPM and is not limited to one side or the other. This is the core of the invention concept in which the output from an SPM detector ca be optimised so that it is possible to increase the detection area of a SPM pixel, submodule or module and maintain a constant output timing response. Work by the inventors has shown that with the standard state of the art, the timing resolution is degraded as large area submodule and modules are created. This invention allows the creation of a device which will have a uniform timing resolution in both the onset and recovery time of the SPM pixel, submodule and module.

4. PRACTICAL IMPLEMENTATIONS

Figure 9:
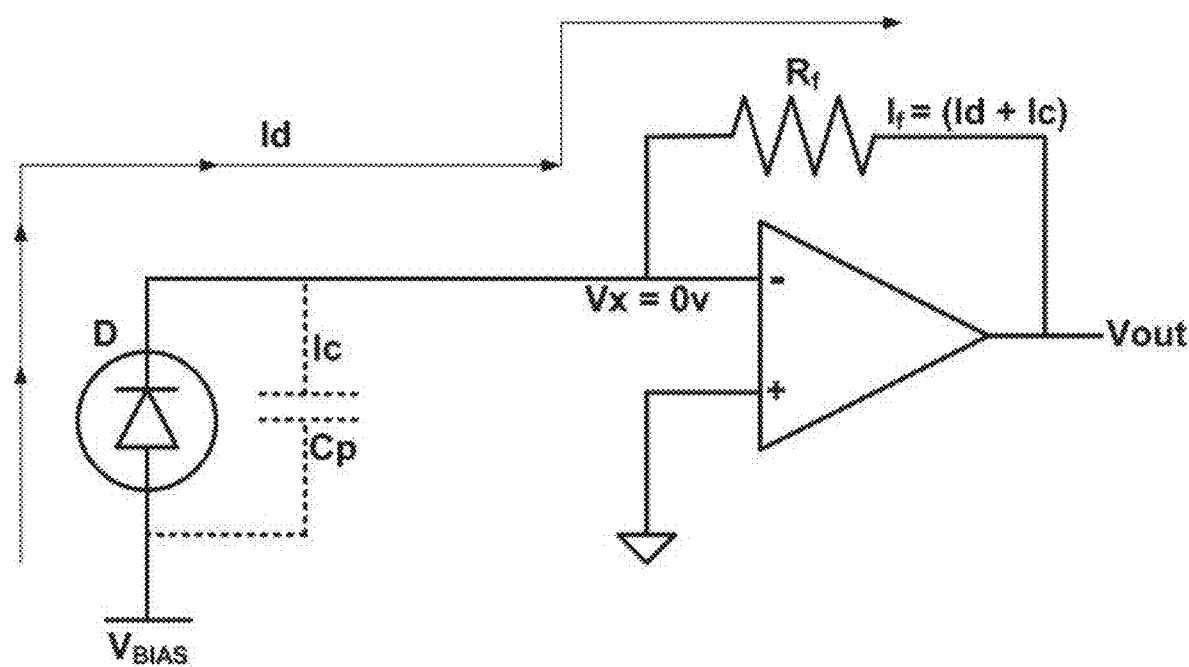
FIG. 9 is an example of a transimpedance amplifier reading out a photodiode.

Transimpedance amplifiers have traditionally been used to provide constant voltage bias and a simplified circuit is shown in FIG. 9.

The op-amp will adjust the current flowing through Rf to ensure that the + and − input voltages are identical. Also very little current flows into the input either the + or − inputs. Therefore, voltage Vx is maintained at 0V by means of adjustments to current If which flows to the diode from the op-amp output.

When the diode switches, the extra current demand is immediately met by the op-amp output and the parasitic capacitances are not required to contribute charge. So onset and recovery times are minimised.

Figure 10:
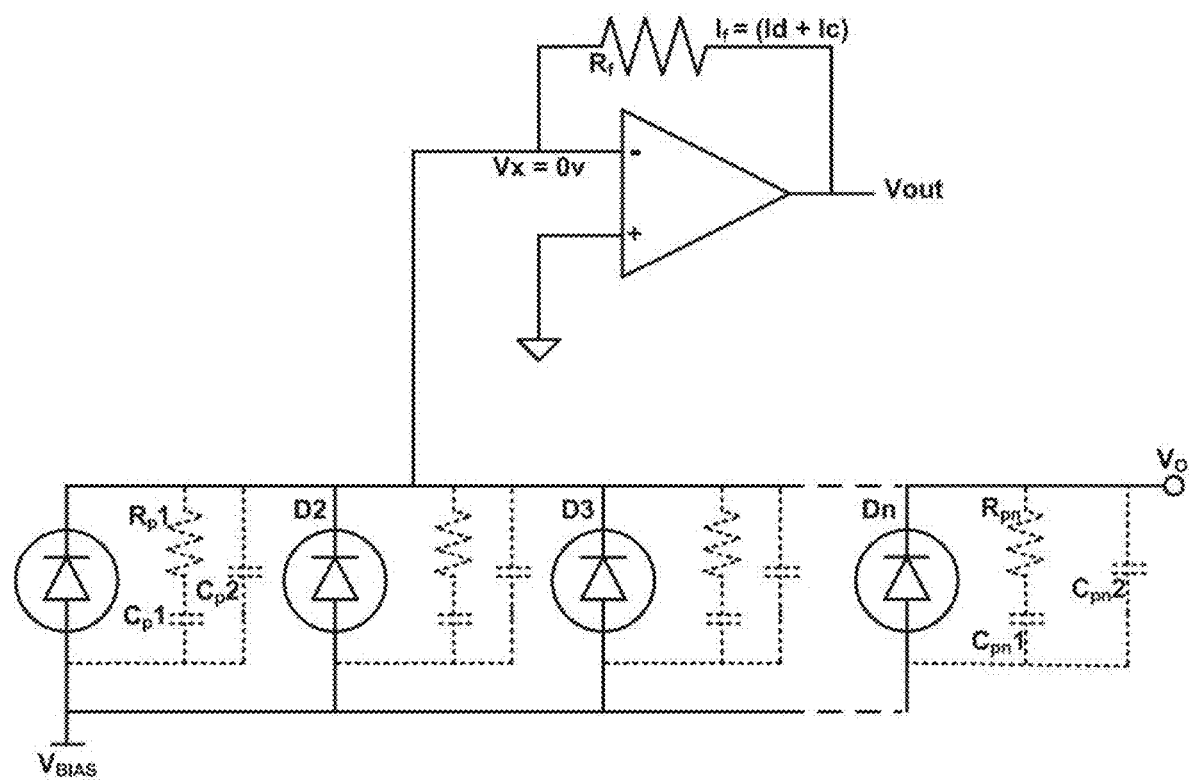
FIG. 10 is a schematic showing a SPM Pixel coupled to a transimpedance amplifier.

FIG. 10 shows an SPM pixel coupled to a trans-impedance amplifier. In this figure the response times of the SPM pixel can be optimised as the voltage is held constant to the SPM pixels.

4.1 Transistor Implementations

Figure 11:
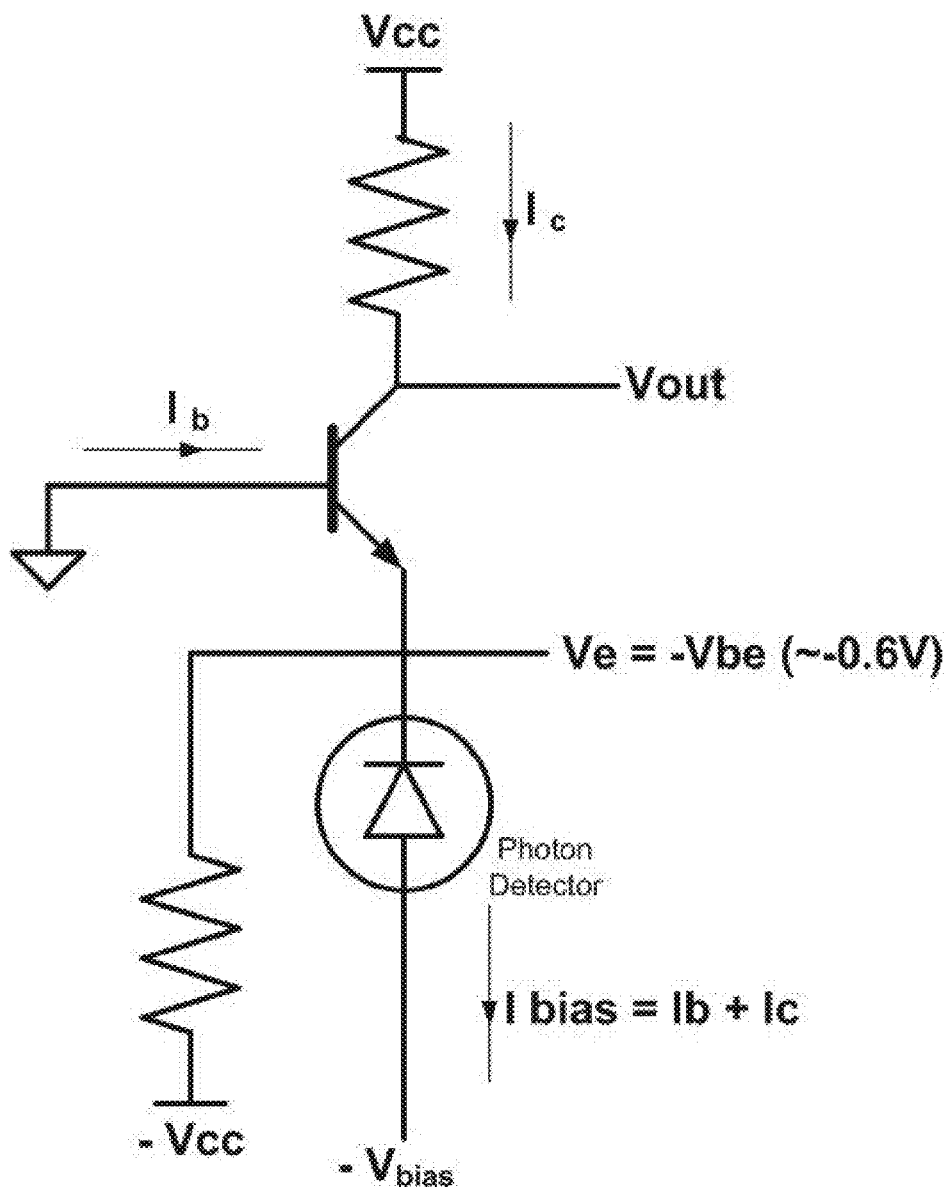
FIG. 11 is a schematic diagram showing a discrete or fully integrated transimpedance amplifier for reading out the SPM Pixel.

A simpler method of implementing the transimpedance function and, one which would be more suitable for integration on the same semiconductor material is shown in FIG. 11.

Here the bias voltage across the photodiode is maintained constant by the bipolar transistor its emitter voltage being 0.6V below the base voltage. When the diode switches, the transistor meets its charge demand and, as with the op-amp version, the parasitic capacitance is not required to alter its charge. The change in bias current is split into 2 components, the transistor collector current, Ic, and the base current, Ib. The base current is approximately related to the collector current by the transistor's hfe figure which can be anything between 20 and 400 depending on the transistor's structure. The bulk of the current will be in the form of Ic and converting this to a voltage using a collector load resistor derives the output signal.

Figure 12:
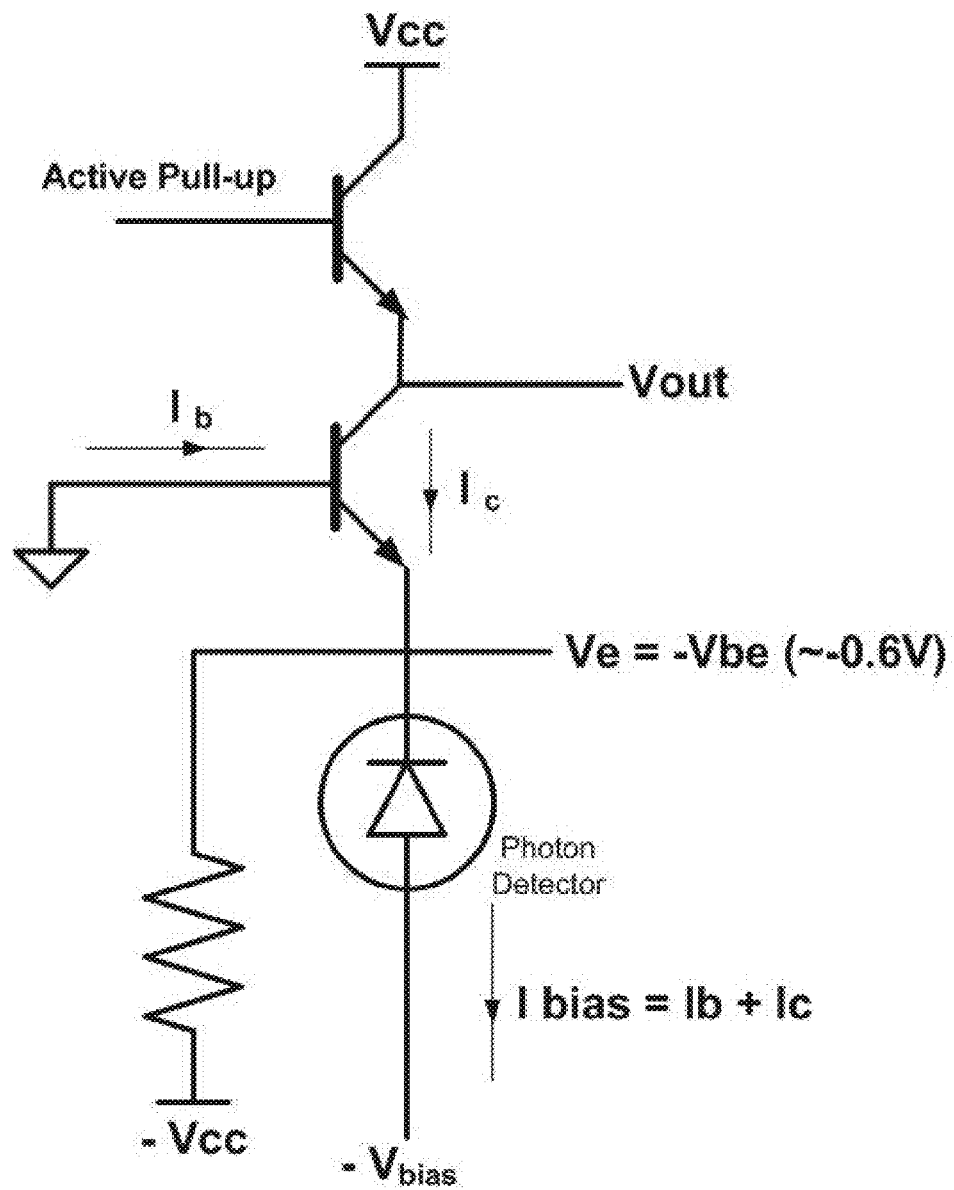
FIG. 12 is a schematic of alternative readout for SPM pixel.

In a practical circuit the output signal would be buffered by a voltage amplifier. Also, instead of a resistive collector load an active pull-up could be used to recharge the collector capacitance quickly. An example of this circuitry is shown in FIG. 12.

The bipolar transistor has the advantage of simplicity and ease of integration on to the same silicon as the photodiode. It has the added advantage of speed and lower susceptibility to instability and ringing as can be the case with external op-amp circuits.

Figure 13:
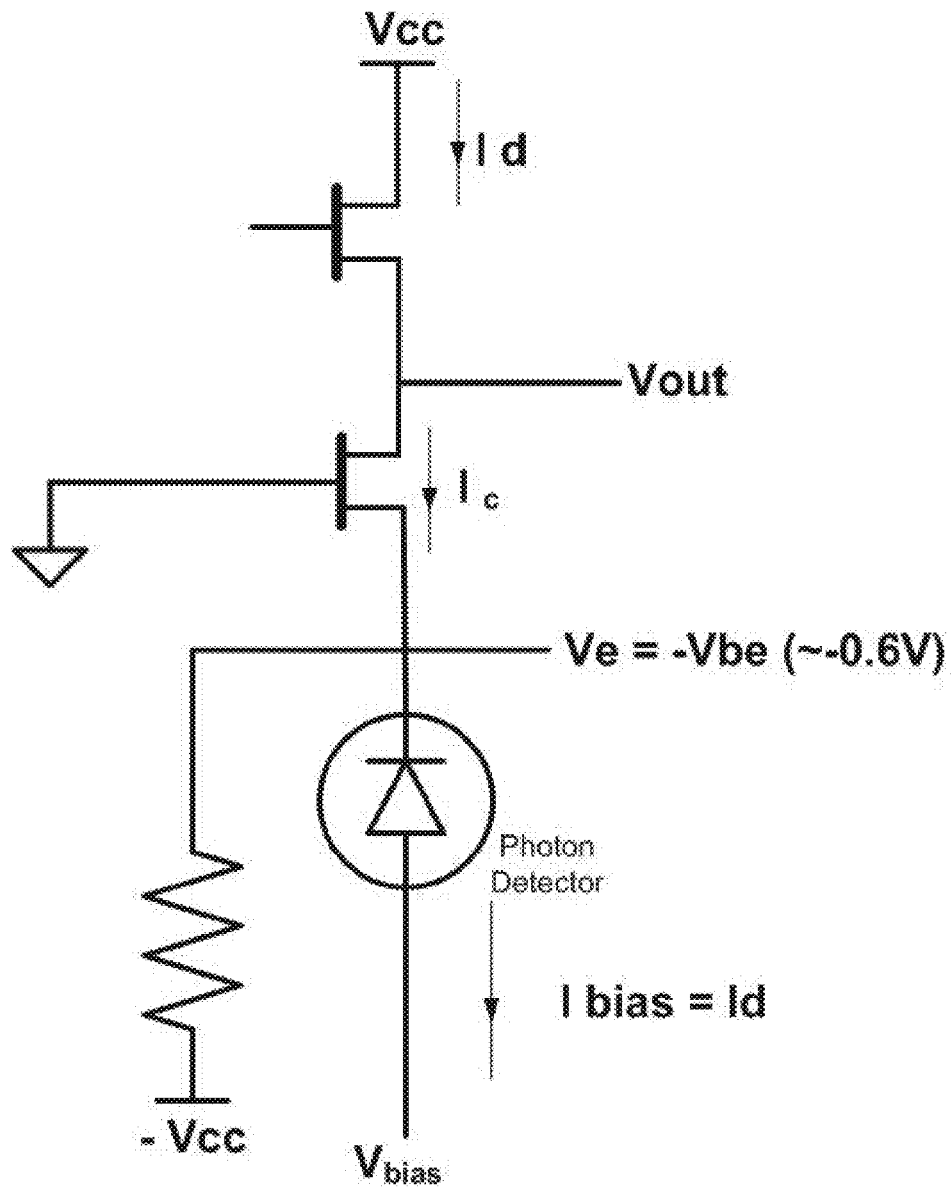
FIG. 13 is a schematic of a MOS implementation of the readout for a SPM pixel.

A MOS transistor can also be used as the amplifying element as shown in FIG. 13. This provides another implementation of the patent invention using metal oxide semiconductor transistors.

5. OPTIMISING SPM OPERATION TRACK CAPACITANCE

Figures 14A, 14B:
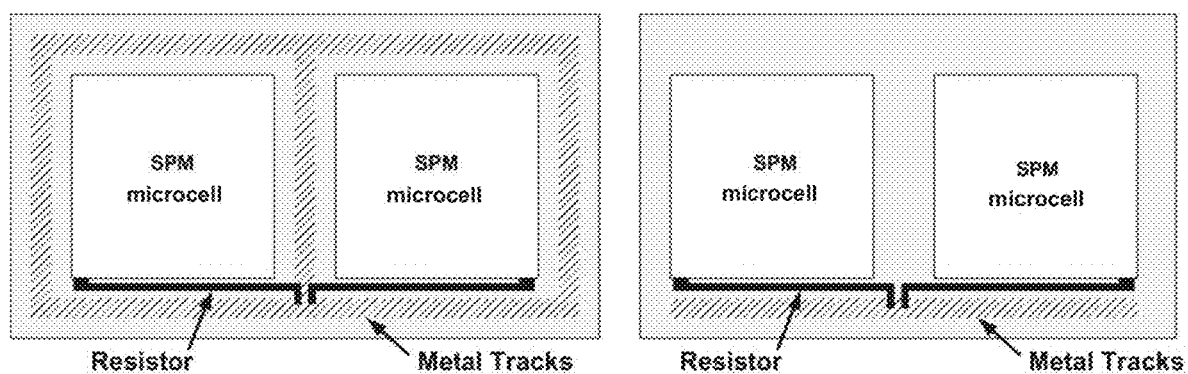
FIG. 14a illustrates a typical layout of two adjacent SPM microcells showing the metal tracking which is used by the microcells.
FIG. 14b illustrates an alternative structure which reduces the track area and thus the capacitance by over a factor of two by reducing the metal area on the detector.
Figure 15:
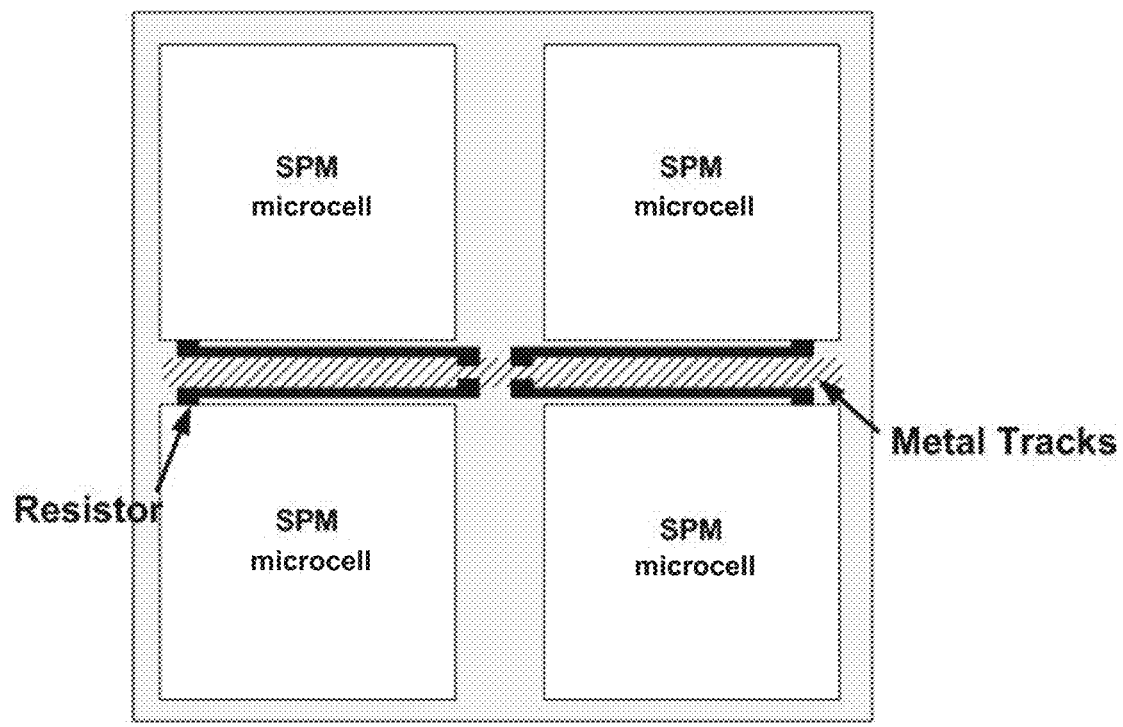
FIG. 15 illustrates an alternative arrangement in which the metal tracking capacitance has been further reduced by using a single metal track to connect to four SPM microcells simultaneously. This results in a capacitance which is scaled by a factor of greater than 4 from the initial design of SPM and reduces the recovery time of the SPM.

By minimising the tracking capacitance of the SPM, it is possible to optimise the capacitance that exists in the SPM array. This can be important to adjust or tune the parasitic capacitance in the array to allow for an optimised signal response from the SPM. This can be very important when combined with on-chip or off-chip electronics. There will exist parasitic resistances in the SPM array which will effect the onset and recovery times. It is important to have control over the factors which adjust the onset and recovery time to make a large area SPM submodule possible. One of these is the metal tracking capacitances. This capacitance is caused by the metal layer which must connect the SPM microcells together. This is the Vsense node in FIG. 4. This node is required to provide a connection between the microcells. However, the metal tracks run on top of an oxide material, typically silicon dioxide, in the case of the SPM pixel. This creates a capacitance which is given by the well known typical capacitance equation where $C=AEoEs/H$. In this case A is the area of the track, Eo is a constant which is the permittivity in a vacuum, Es is the dielectric constant and H is the height of the dielectric layer. From this equation it is possible to see that as the area of the metal track is increased the capacitance, Ctrack will increase. It is a known technique to modify the dielectric thickness to minimise the tracking capacitance. It is also possible to make the metal track as thin as possible to minimise capacitance. Given the design rules of the process that the SPM is on, this will provide a capacitance which is set by the minimum design rules sizing for the metal tracks and the dielectric thickness that can be achieved while maintaining the optical response of the SPM. It is also possible to employ novel SPM layouts to minimise and optimise tracking capacitance. The standard metal layout is shown in FIG. 14*a*. In this the metal track is shown to pass around the side of every diode. This provides both a horizontal and vertical metal track to connect out the SPM pixel. This provides the lowest resistance path for the Vsense node, however, it does provide a high capacitance. FIG. 14*b* shows an optimised tracking scheme in which a single metal line is provided for each row. This metal connection runs horizontal. The vertical metal track has been removed. This lowers the capacitance of the metal tracks by approximately greater than 50%. A further improvement can be seen in the novel configuration in FIG. 15. In FIG. 15, a 2×2 array of SPM pixels is shown. All pixels are identical. In this configuration the bottom two pixels, while identical, have been flipped vertically to allow a single metal track to serve as a connection point for two rows. This when combined with the improvements in FIG. 14*b* can provide a greater than 25% less tracking capacitance than the standard state of the art diode shown in FIG. 14*a*.

6. VARIATIONS

This invention allows the formation of large area SPM submodules which are formed from combining arbitrary sized pixels of SPM detectors together. This allows for both pixellated and non-pixellated (or summed) SPM submodules to be formed. The submodule can be made to an arbitrary size and the use of on chip or off chip electronics can be used to provide for a uniform onset and recovery time of the SPM output response. This is extremely important in any application, PET being one example, which must look record fast optical pulses.

There is an embodiment in which the circuitry required to produce the minimal response time is off chip electronics.

There is an embodiment in which the circuitry required to produce the minimal response times is on chip electronics fabricated using the same process which was used to fabricated the SPM.

There is an embodiment in which the circuitry required to produce the minimal response times is provided by circuitry which is combined with the SPM in a hybrid configuration, either through flip chip of the SPM and circuitry or through hybrid wire bonding techniques.

There is an embodiment in which a single SPM pixel is optimised for minimal onset and recovery time.

There is an embodiment in which the single SPM pixel is combined in an array to form a larger SPM submodule which has a minimal onset and recovery time.

There is an embodiment in which the SPM submodule is combined with other submodules into a larger module which is optimised for minimal onset and recovery times.

7. SUMMARY OF THE INVENTION

According to a first aspect of the present invention there is provided a detector comprising a silicon photomultiplier and circuitry adapted to minimise the onset and recovery time of an output signal by maintaining a substantially constant voltage on a connection node in a silicon photomultiplier pixel between internal microcells.

According to a second aspect of the present invention there is provided circuitry for biasing a silicon photomultiplier such that a substantially constant voltage is applied to an output of the silicon photomultiplier for the purpose of maintaining a constant voltage on an internal node of the silicon photomultiplier.

According to a third aspect of the present invention there is provided a method of optimising the capacitance of a silicon photomultiplier pixel to enable minimisation of an onset and recovery time of an output signal.

According to a fourth aspect of the present invention there is provided discrete off-chip circuitry for providing a substantially constant voltage to a silicon photomultiplier to maintain an optimised onset and recovery time.

According to a fifth aspect of the present invention there is provided a method of combining on-chip circuitry for providing a substantially constant voltage to a silicon photomultiplier output node.

According to a sixth aspect of the present invention there is provided a method by which a large array of silicon photomultiplier pixels are combined with minimal onset and recovery times.

The circuitry may comprise on-chip bipolar transistors.

The circuitry may comprise on-chip metal oxide semiconductor transistors.

The circuitry may comprise hybrid circuits which are provided on chip through flip chip assembly, or through direct wire bond connection between the silicon photomultiplier and the circuitry.

A single silicon photomultiplier pixel may be optimised to provide a minimal onset and recovery time.

Multiple silicon photomultiplier pixels may be combined together into a submodule with a minimal onset and recovery time.

Multiple silicon photomultiplier submodules may be combined together into a larger module with minimal onset and recovery times.

Circuitry may be used to provide minimal onset and recovery times.

According to a seventh aspect of the present invention there is provided silicon photomultiplier circuitry comprising a silicon photomultiplier pixel comprising a plurality of silicon photomultiplier microcells, the silicon photomultiplier circuitry comprising control circuitry adapted to maintain a substantially constant voltage on a connection node between microcells of the pixel.

The control circuitry may comprise current to voltage conversion circuitry.

The control circuitry may comprise transimpedance amplifier circuitry.

The control circuitry may be substantially as shown in, or as described above with reference to, FIGS. 9 to 13.

The connection node may be an output or sensing node for the microcells of the pixel.

The silicon photomultiplier circuitry may comprise a plurality of such silicon photomultiplier pixels, the silicon photomultiplier circuitry comprising such control circuitry for each silicon photomultiplier pixel.

The silicon photomultiplier circuitry may comprise separate control circuitry for each silicon photomultiplier pixel.

The microcells may be arranged in a plurality of rows, and the silicon photomultiplier circuitry may comprise a metal tracking arrangement for inter-connecting the microcells, the arrangement comprising a single metal line for each row or for each pair of rows.

According to an eighth aspect of the present invention there is provided a metal tracking arrangement for silicon photomultiplier circuitry having a silicon photomultiplier pixel with a plurality of silicon photomultiplier microcells arranged in a plurality of rows, the arrangement being for inter-connecting the microcells and comprising a single metal line for each row or for each pair of rows.

The metal tracking arrangement may be substantially as shown in FIG. 14(b) or FIG. 15.

It will be appreciated that the tracking need not be formed of metal, and that any electrically conductive material would be suitable. The term "metal" here is to be interpreted as covering any electrically conductive material.

An embodiment of the present invention relates to a circuitry which can be used for optimising the timing output pulse for an array of silicon photomultipliers. We seek in an embodiment of the present invention to fully describe the timing response of the SPM at the pixel, submodule and module level. Operation of the SPM with relation to timing, both onset and recovery is fully explored and both diode layout level and circuitry required for optimising the onset and recovery time are given in this patent invention.

It will be appreciated that the substantially constant voltage can be applied to either one side or the other of the SPM. It is possible to provide a similar effect by applying the substantially constant voltage to either side of the microcells.

What is claimed is:

1. Silicon photomultiplier circuitry having a substantially uniform output response recovery time, the silicon photomultiplier circuitry comprising
a silicon photomultiplier pixel comprising a parallel array of silicon photomultiplier microcells, each microcell comprising an on-chip quench element and a photodiode, wherein the parallel array of silicon photomultiplier microcells are interconnected by an on-chip metal track; and
an on-chip readout transistor adapted to maintain a substantially constant voltage on a common output node of the microcells such that the effect of parasitic capacitance associated with the on-chip metal track is substantially negated from affecting an output response recovery time of a firing microcell.

2. Circuitry as claimed in claim 1, wherein the on-chip readout transistor is a bipolar transistor.

3. Circuitry as claimed in claim 1, wherein the on-chip readout transistor is a MOS transistor.

4. Circuitry as claimed in claim 2, further comprising a pick-up transistor operably coupled to the on-chip readout transistor to provide an active pull-up.

5. Circuitry as claimed in claim 4, wherein the pick-up transistor is a bipolar transistor.

6. Circuitry as claimed in claim 4, wherein the pick-up transistor is a MOS transistor.

7. Circuitry as claimed in claim 1, further comprising a pull-up resistor operably coupled to the on-chip readout transistor.

8. Circuitry as claimed in claim 7, wherein the pull-up resistor is located on-chip.

9. Circuitry as claimed in claim 1, further comprising an external readout circuit in communication with the on-chip readout transistor.

10. Circuitry as claimed in claim 1, comprising a plurality of such silicon photomultiplier pixels, the silicon photomultiplier circuitry comprising a corresponding on-chip readout transistor for each silicon photomultiplier pixel.

11. Circuitry as claimed in claim 1, wherein the silicon photomultiplier microcells are arranged in a plurality of rows, and comprising a metal tracking arrangement for inter-connecting the silicon photomultiplier microcells, the arrangement comprising a single metal line for each row or for each pair of rows.

12. Circuitry as claimed in claim 1, wherein pairs of microcells are coupled to a common node using a metal track adjacent to each microcell of the pairs of microcells on one side thereof.

13. Circuitry as claimed in claim 1, further comprising reverse biasing means for operating the photodiodes in breakdown mode.

14. Circuitry as claimed in claim 1, wherein the on-chip quench elements are positioned substantially outside of active areas of the silicon photomultiplier microcells to maximise the footprint of the active areas available to detect light.

15. Circuitry as claimed in claim 14, wherein the active areas are free of covering materials.

16. A photomultiplier circuitry having a substantially uniform output response recovery time, the photomultiplier circuitry comprising:
a substrate;
a parallel array of avalanche photodiodes situated on the substrate, the avalanche photodiodes having active areas for detecting light and adapted to operate in Geiger mode in response to detected light;
quenching elements situated on the substrate which are electrically interconnected in series to corresponding avalanche photodiodes to stop an avalanche breakdown of the avalanche photodiodes;
a metal track situated on the substrate configured to interconnect the parallel array of avalanche photodiodes; and a readout transistor adapted to maintain a substantially constant voltage on an output node of the photodiodes such that the effect of parasitic capacitance associated with the metal track is substantially negated from affecting an output response recovery time of a firing microcell.

17. The photomultiplier circuitry of claim 16, wherein the metal track is adjacent to each of a plurality of photodiodes on one side thereof.

18. The photomultiplier circuitry of claim 16, further comprising reverse biasing means for operating the avalanche photodiodes in breakdown mode.

19. The photomultiplier circuitry of claim 16, wherein the quenching elements are positioned substantially outside the active areas to maximise the footprint of the active areas available to detect light.

20. The photomultiplier circuitry of claim 16, wherein the active areas are free of covering materials.

21. A light detector, comprising:
a photomultiplier circuitry having a substantially uniform output response recovery time, the photomultiplier circuitry comprising:
a substrate;
a parallel array of avalanche photodiodes situated on the substrate, the avalanche photodiodes having active areas for detecting light and adapted to operate in Geiger mode in response to detected light;
quenching elements situated on the substrate which are electrically interconnected to corresponding avalanche photodiodes to stop an avalanche breakdown of the avalanche photodiodes,
a metal track situated on the substrate configured to interconnect the parallel array of avalanche photodiodes;
an on-chip readout transistor adapted to maintain a substantially constant voltage on the metal track such that the effect of parasitic capacitance is substantially negated from affecting an output response recovery time of a firing avalanche photodiodes; and
an external readout circuit in communication with the on-chip readout transistor.

22. The light detector and readout system of claim 21, wherein the quenching elements are positioned substantially outside the active areas to maximise the footprint of the active areas available to detect light.

23. The light detector and readout system of claim 21, wherein the active areas are free of covering materials.

24. Silicon photomultiplier circuitry comprising:
a silicon photomultiplier pixel comprising an array of interconnected silicon photomultiplier microcells, each microcell comprising an on-chip quench element and a photodiode;
an on-chip readout transistor adapted to maintain a substantially constant voltage on a common output node of the microcells; and
a pick-up transistor operably coupled to the on-chip readout transistor to provide an active pull-up.

25. The silicon photomultiplier circuitry of claim 24, wherein the on-chip readout transistor and the pick-up transistor are bipolar transistors.

26. The silicon photomultiplier circuitry of claim 24, wherein the on-chip readout transistor and the pick-up transistor are MOS transistors.

* * * * *